(12) United States Patent
Dasu et al.

(10) Patent No.: US 11,487,445 B2
(45) Date of Patent: Nov. 1, 2022

(54) PROGRAMMABLE INTEGRATED CIRCUIT WITH STACKED MEMORY DIE FOR STORING CONFIGURATION DATA

(71) Applicant: Intel Corporation, Santa Clara, CA (US)

(72) Inventors: Aravind Dasu, Milpitas, CA (US); Scott Weber, Piedmont, CA (US); Jun Pin Tan, Kepong (MY); Arifur Rahman, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 15/358,738

(22) Filed: Nov. 22, 2016

(65) Prior Publication Data

US 2018/0143777 A1 May 24, 2018

(51) Int. Cl.
*G06F 9/46* (2006.01)
*G06F 3/06* (2006.01)
(Continued)

(52) U.S. Cl.
CPC ............ *G06F 3/0629* (2013.01); *G06F 3/061* (2013.01); *G06F 3/0647* (2013.01);
(Continued)

(58) Field of Classification Search
CPC ............ G06F 15/7867; G06F 15/7889; G06F 15/7885; G06F 15/7871; G06F 15/7875; G06F 15/7878; G06F 15/7882; G06F 15/7803; G06F 15/7807; G06F 15/7839; G06F 15/781; G06F 15/7814; G06F 15/7821; G06F 15/7864; G06F 15/7842; G06F 15/7846; G06F 9/3877;
(Continued)

(56) References Cited

U.S. PATENT DOCUMENTS 4,500,905 A * 2/1985 Shibata .................... G11C 5/00
257/74
5,347,428 A * 9/1994 Carson ................ H01L 25/0657
174/260
(Continued)

FOREIGN PATENT DOCUMENTS

WO WO-2012022031 A1 * 2/2012 ....... G06K 19/07732

*Primary Examiner* — Emerson C Puente
*Assistant Examiner* — Zhi Chen
(74) *Attorney, Agent, or Firm* — Fletcher Yoder, P.C.

(57) ABSTRACT

A system may include a host processor, a coprocessor for accelerating tasks received from the host processor, and one or more memory dies mounted to the coprocessor. The coprocessor and the memory die may be part of an integrated circuit package. The memory die may convey configuration bit streams to one or more logic sectors in programmable circuitry of the coprocessor over through-silicon vias. Each logic sector may include one or more data registers that are loaded with configuration data from the memory die. Multiple data registers may be loaded with configuration data simultaneously. The configuration data may be loaded onto an array of configuration memory cells using the data registers. Multiple data registers may be pipelined to allow simultaneous loading of configuration data into multiple sub-arrays of the array of configuration memory cells.

16 Claims, 11 Drawing Sheets

(51) Int. Cl.
*G06F 15/78* (2006.01)
*G11C 5/02* (2006.01)
*G11C 5/06* (2006.01)

(52) U.S. Cl.
CPC ........ *G06F 3/0673* (2013.01); *G06F 15/7871* (2013.01); *G11C 5/02* (2013.01); *G11C 5/06* (2013.01); *Y02D 10/00* (2018.01)

(58) Field of Classification Search
CPC ...... G06F 3/0629; G06F 3/061; G06F 3/0647; G06F 3/0673; G11C 5/02; G11C 5/06
See application file for complete search history.

(56) References Cited

U.S. PATENT DOCUMENTS

| | | | | |
|---|---|---|---|---|
| 5,535,406 | A * | 7/1996 | Kolchinsky | G06F 15/7867 712/10 |
| 5,583,450 | A * | 12/1996 | Trimberger | H03K 19/17704 326/40 |
| 6,091,263 | A | 7/2000 | New et al. | |
| 6,243,272 | B1 * | 6/2001 | Zeng | H05K 1/181 174/262 |
| 6,321,318 | B1 * | 11/2001 | Baltz | G06F 12/0802 711/154 |
| 6,347,344 | B1 * | 2/2002 | Baker | G06F 13/102 345/501 |
| 6,417,462 | B1 * | 7/2002 | Dabral | H05K 1/0246 174/262 |
| 6,678,167 | B1 * | 1/2004 | Degani | H01L 23/36 257/E23.101 |
| 7,136,958 | B2 * | 11/2006 | Jeddeloh | G11C 5/00 710/317 |
| 7,218,647 | B2 * | 5/2007 | Ozguner | H04L 69/22 370/389 |
| 7,415,579 | B2 * | 8/2008 | Baumhof | G06F 13/1605 711/151 |
| 7,518,396 | B1 * | 4/2009 | Kondapalli | H03K 19/17758 326/38 |
| 7,589,558 | B1 * | 9/2009 | Tseng | G06F 30/34 326/41 |
| 7,973,555 | B1 * | 7/2011 | Trimberger | H03K 19/17736 326/38 |
| 8,058,897 | B1 * | 11/2011 | Lu | H03K 19/177 326/38 |
| 8,110,899 | B2 * | 2/2012 | Reed | H01L 25/0652 257/621 |
| 8,112,678 | B1 * | 2/2012 | Lewis | G06F 11/106 714/48 |
| 8,136,071 | B2 | 3/2012 | Solomon | |
| 8,294,252 | B1 * | 10/2012 | Patel | H01L 23/481 257/686 |
| 8,358,525 | B2 * | 1/2013 | Shepard | H01L 27/12 365/51 |
| 8,879,296 | B2 | 11/2014 | Choi | |
| 8,922,243 | B2 | 12/2014 | Jayasena et al. | |
| 9,105,323 | B2 * | 8/2015 | Jeddeloh | G06F 13/4022 |
| 9,247,642 | B2 * | 1/2016 | Chen | H01R 13/04 |
| 9,344,091 | B2 | 5/2016 | Jayasena et al. | |
| 9,389,972 | B2 | 7/2016 | Chadha et al. | |
| 9,425,802 | B1 | 8/2016 | Xiao | |
| 9,432,298 | B1 * | 8/2016 | Smith | H04L 49/9057 |
| 9,942,169 | B1 * | 4/2018 | Detwiler | H04L 49/25 |
| 10,185,499 | B1 * | 1/2019 | Wang | G06F 3/0611 |
| 2001/0040258 | A1 * | 11/2001 | Gonzalez | H01L 21/823462 257/368 |
| 2002/0004277 | A1 * | 1/2002 | Ahn | H01L 21/823462 438/275 |
| 2002/0072893 | A1 * | 6/2002 | Wilson | G06F 13/1605 714/E11.207 |
| 2003/0183914 | A1 * | 10/2003 | Wallace | G06K 19/07732 257/E25.013 |
| 2005/0062173 | A1 * | 3/2005 | Vu | H01L 23/3114 257/737 |
| 2005/0063120 | A1 * | 3/2005 | Sinha | G01K 15/00 361/103 |
| 2007/0022273 | A1 * | 1/2007 | Naffziger | G06F 9/3012 712/216 |
| 2008/0006947 | A1 * | 1/2008 | Akiba | H01L 25/18 257/E23.142 |
| 2009/0103345 | A1 * | 4/2009 | McLaren | G11C 5/02 365/64 |
| 2009/0217102 | A1 * | 8/2009 | Co | G11C 29/56 714/42 |
| 2009/0236699 | A1 * | 9/2009 | Gordon | H01L 23/556 257/629 |
| 2010/0121994 | A1 | 5/2010 | Kim et al. | |
| 2010/0226657 | A1 * | 9/2010 | Raymond | H01L 31/101 398/141 |
| 2011/0027485 | A1 * | 2/2011 | Kahn | C09D 5/1693 427/331 |
| 2011/0307746 | A1 * | 12/2011 | Sullivan | G06F 1/263 714/57 |
| 2012/0005396 | A1 * | 1/2012 | Sargeant | G06F 13/1684 710/316 |
| 2012/0119374 | A1 * | 5/2012 | Rahman | H01L 21/76898 257/774 |
| 2012/0138927 | A1 | 6/2012 | Kang | |
| 2012/0311238 | A1 * | 12/2012 | Im | G06F 3/064 711/103 |
| 2012/0324174 | A1 * | 12/2012 | Damodaran | G06F 9/30141 711/154 |
| 2013/0148401 | A1 * | 6/2013 | Fai | H01L 23/5226 365/63 |
| 2014/0038836 | A1 * | 2/2014 | Higgins | G16B 15/00 506/9 |
| 2014/0071778 | A1 * | 3/2014 | Coteus | G06F 13/1668 365/222 |
| 2014/0115281 | A1 * | 4/2014 | Coteus | G06F 1/3275 711/154 |
| 2014/0117430 | A1 * | 5/2014 | Lee | H01L 25/18 257/296 |
| 2014/0176187 | A1 | 6/2014 | Jayasena et al. | |
| 2014/0185352 | A1 * | 7/2014 | Chow | G11C 8/12 365/63 |
| 2014/0238640 | A1 * | 8/2014 | Arvelo | F16L 41/10 165/76 |
| 2014/0281193 | A1 * | 9/2014 | Schaefer | G11C 7/10 711/105 |
| 2014/0340113 | A1 * | 11/2014 | Tseng | H01L 25/0657 326/9 |
| 2015/0106574 | A1 * | 4/2015 | Jayasena | G06F 9/3881 711/154 |
| 2016/0118371 | A1 * | 4/2016 | Park | H01L 25/0657 257/773 |
| 2016/0246660 | A1 * | 8/2016 | Nishihara | G06F 13/14 |
| 2017/0308461 | A1 * | 10/2017 | Niu | G06F 9/5016 |

* cited by examiner

PROGRAMMABLE INTEGRATED CIRCUIT WITH STACKED MEMORY DIE FOR STORING CONFIGURATION DATA

BACKGROUND

This relates to integrated circuits and, more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements on a programmable integrated circuit to configure the device to perform the functions of the custom logic circuit.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration.

Programmable devices may be used for coprocessing in big-data or fast-data applications. For example, programmable devices may be used in application acceleration tasks in a datacenter and may be reprogrammed during datacenter operation to perform different tasks. However, the speed of reconfiguration of programmable devices is traditionally several orders of magnitude slower than the desired rate of virtualization in datacenters. Moreover, on-chip caching or buffering of pre-fetched configuration bit-streams to hide the latency of reconfiguration is undesirably expensive in terms of silicon real estate. Additionally, repeated fetching of configuration bit-streams from off-chip storage via the entire configuration circuit chain is energy intensive.

Situations frequently arise where it would be desirable to design and implement programmable devices with improved reconfiguration speed, reduced energy consumption, and parallel reconfiguration capabilities.

It is within this context that the embodiments herein arise.

SUMMARY

It is appreciated that the present invention can be implemented in numerous ways, such as a process, an apparatus, a system, a device, or a method on a computer readable medium. Several inventive embodiments of the present invention are described below.

A system may include a host processor, an integrated circuit (e.g., coprocessor) coupled to the host processor, and a memory die stacked directly on the integrated circuit. The memory die and the integrated circuit may be part of the same integrated circuit package. In some cases, the system may include one or more additional memory dies stacked directly on the integrated circuit.

The integrated circuit may include programmable circuitry. The memory die may store configuration bit streams for configuring the programmable circuitry. The integrated circuit may communicate with the memory die over through-silicon vias formed within the integrated circuit. The configuration bit streams may be conveyed from the memory die to the programmable circuitry of the integrated circuit over the through-silicon vias.

The programmable circuitry may include multiple logic sectors that are coupled to respective associated local sector managers. These local sector managers may help retrieve the configuration bit streams from the memory die. Each of the logic sectors may include an array of memory cells, an address register coupled to the array of memory cells, and a data register coupled to the array of memory cells. The data register may also be coupled to the memory die through at least some of the through-silicon vias.

In some embodiments, the logic sector may include first and second sub-arrays of memory cells, a first data register coupled to the first sub-array of memory cells, and a second data register coupled to the second sub-array of memory cells. The local sector manager associated with the logic sector may control the first and second data registers. A selected one of the configuration bit streams may be loaded from the memory die onto the first and second data registers simultaneously (e.g., in parallel). Data in the first data register may be transferred to the second data register. The first and second data registers may load a selected one of the configuration bit streams into the first and second sub-arrays of memory cells in parallel. The second data register may be a pipelined data register. If desired, the logic sector may include any number of additional pipelined data registers.

Further features of the invention, its nature and various advantages will be more apparent from the accompanying drawings and following detailed description.

DETAILED DESCRIPTION

Embodiments of the present invention relate to integrated circuits and, more particularly, to programmable integrated circuits. It will be recognized by one skilled in the art, that the present exemplary embodiments may be practiced without some or all of these specific details. In other instances, well-known operations have not been described in detail in order not to unnecessarily obscure the present embodiments.

Programmable integrated circuits use programmable memory elements to store configuration data. Configuration data may be generated based on source code corresponding to application-specific tasks to be performed in parallel on the programmable integrated circuit. During programming of a programmable integrated circuit, configuration data is loaded into the memory elements. The memory elements may be organized in arrays having numerous rows and columns. For example, memory array circuitry may be formed in hundreds or thousands of rows and columns on a programmable logic device integrated circuit.

During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

It may sometimes be desirable to configure or reconfigure the programmable integrated circuit as an accelerator circuit to efficiently perform parallel processing tasks. The accelerator circuit may include multiple columns soft processors of various types that are specialized for different types of parallel tasks. The accelerator circuit may be dynamically reconfigured to optimally assign and perform the parallel tasks.

Figure 1:
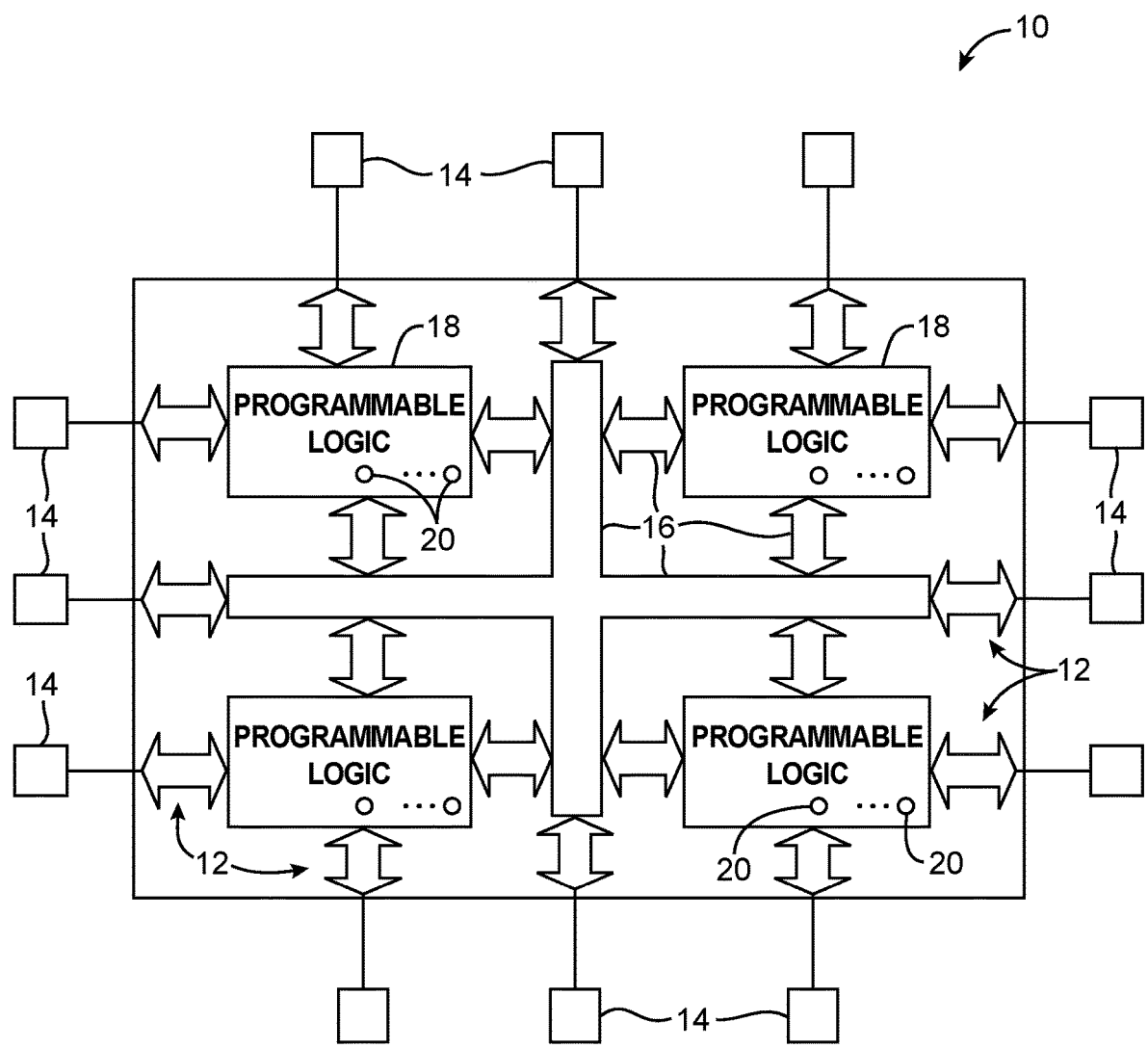
FIG. 1 is a diagram of an illustrative programmable integrated circuit in accordance with an embodiment.

An illustrative programmable integrated circuit such as programmable logic device (PLD) 10 is shown in FIG. 1. As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements 20 may each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
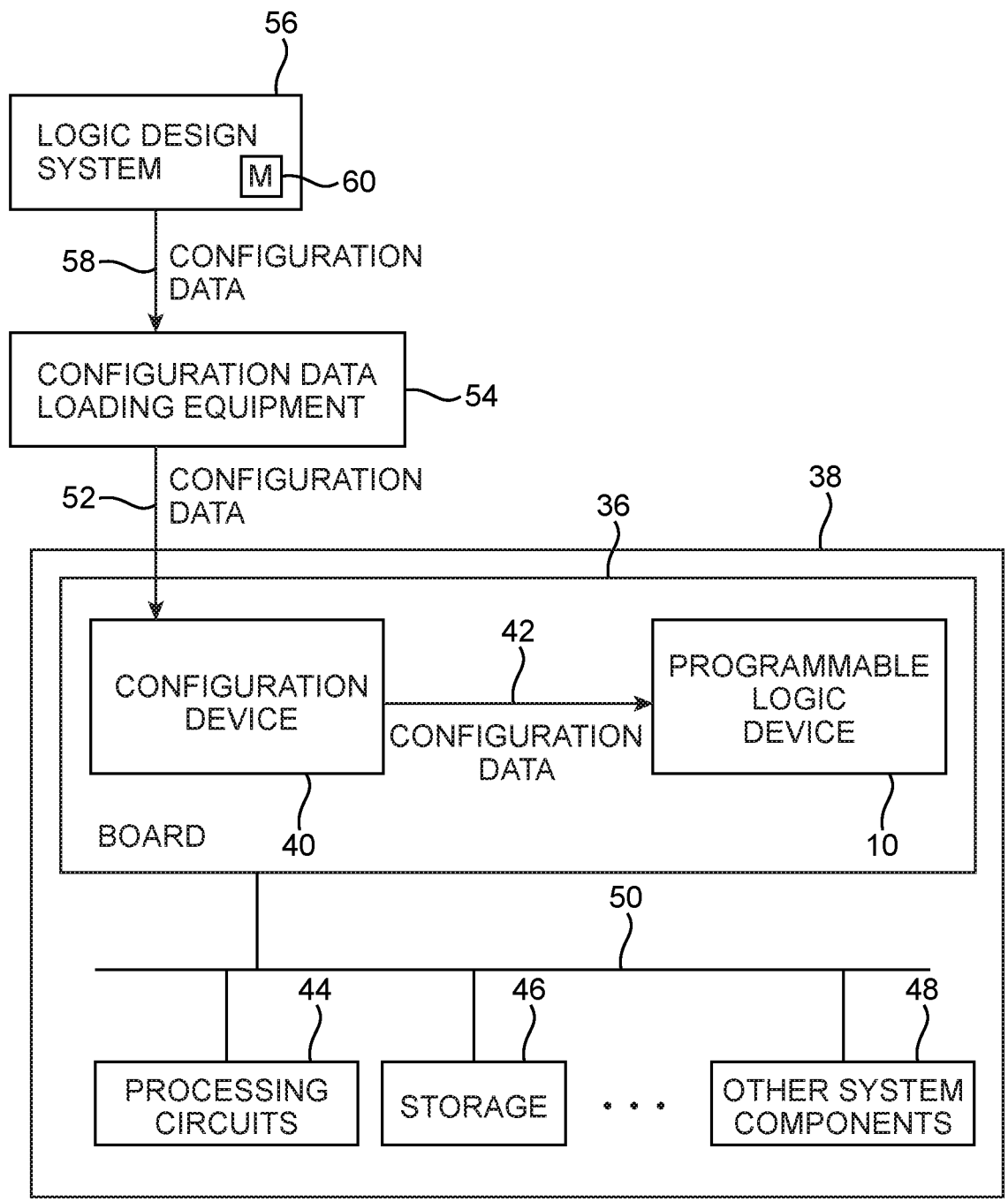
FIG. 2 is a diagram showing how configuration data is created by a logic design system and loaded into a programmable device to configure the device for operation in a system in accordance with an embodiment.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10.

Circuit 40 may be an erasable-programmable read-only memory (EPROM) chip, a programmable logic device configuration data loading chip with built-in memory (sometimes referred to as a "configuration device"), or another suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses, traces, and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. Logic design system 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data, which is provided to configuration device 40. Upon power-up, configuration device 40 and data loading circuitry on programmable logic device 10 is used to load the configuration data into CRAM cells 20 of device 10. Device 10 may then be used in normal operation of system 38.

After device 10 is initially loaded with a set of configuration data (e.g., using configuration device 40), device 10 may be reconfigured by loading a different set of configuration data. Sometimes it may be desirable to reconfigure only a portion of the memory cells on device 10 via a process sometimes referred to as partial reconfiguration. As memory cells are typically arranged in an array, partial reconfiguration can be performed by writing new data values only into selected portion(s) in the array while leaving portions of array other than the selected portion(s) in their original state.

Figure 3:
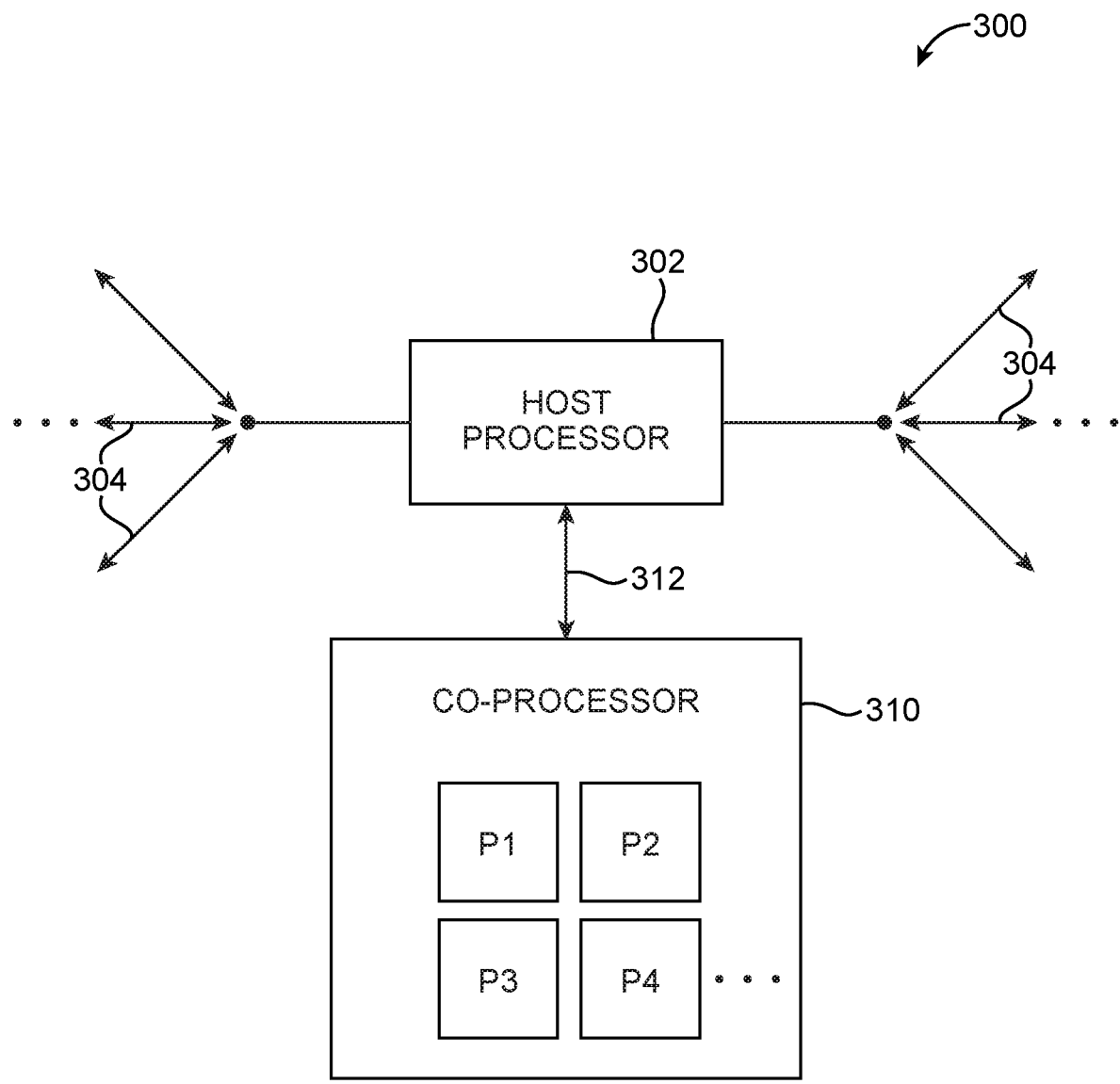
FIG. 3 is a diagram showing how a programmable integrated circuit may be used as a coprocessor in support of a host processor in accordance with an embodiment.

Partial reconfiguration may be a particularly useful feature when developing an acceleration framework. For example, consider a scenario in which a system such as system 300 includes a host processor 302 that is coupled to other network components via paths 304 (see, e.g., FIG. 3). As shown in FIG. 3, host processor 302 may be coupled to a coprocessor (e.g., an accelerator circuit) such as coprocessor 310 (sometimes referred to herein as accelerator circuit 310, or accelerator 310) via path 312. Accelerator circuit 310 may be a programmable integrated circuit such as device 10 of FIG. 1 or alternatively, multiple accelerator circuits may be in a programmable integrated circuit. Accelerator circuit 310 may include various processing nodes (e.g., processing cores, processor cores) such as cores P1-P4 to help accelerate the performance of host processor 302. Cores P1-P4 may be soft processor cores or soft processors that are configurable (e.g., programmable). In some instances, processor cores such as cores P1-P4 may be implemented as logic sectors in accelerator circuit 310.

Configured as such, accelerator circuit 310 may sometimes be referred to as a "hardware accelerator." As examples, the processing cores on the coprocessor may be used to accelerate a variety of functions, which may include but are not limited to: encryption, Fast Fourier transforms, video encoding/decoding, convolutional neural networks (CNN), firewalling, intrusion detection, database searching, domain name service (DNS), load balancing, caching network address translation (NAT), and other suitable network packet processing applications, just to name a few.

Figure 4:
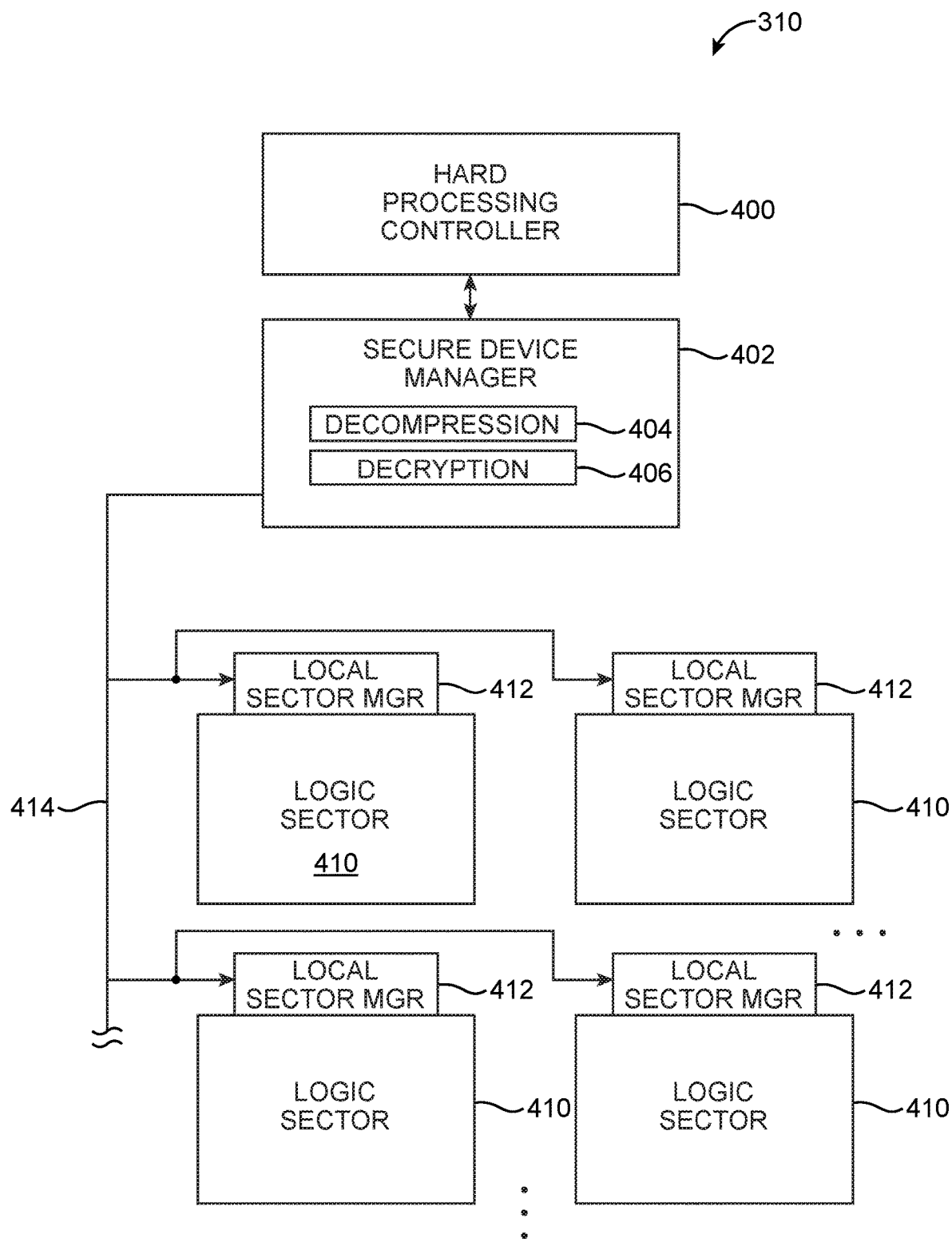
FIG. 4 is a diagram of an illustrative programmable integrated circuit having multiple logic sectors managed by local sector managers and a secure device manager in accordance with an embodiment.

For instances in which cores Pl-P4 are implemented as logic sectors in accelerator circuit 310, each logic sector may be managed using local sector managers, which may in turn be managed using a secure device manager. As shown in FIG. 4, accelerator circuit 310 may include multiple logic sectors 410 (sometimes referred to as sectors 410). Each logic sector may be managed by a respective one of local sector managers (LSM) 412. Local sector managers 412 may be managed by secure device manager 402. Hard processing controller 400 may receive configuration data (e.g., configuration bit streams) and/or accelerator requests from a host processor (e.g., host processor 302 of FIG. 3). Secure device manager 402 may receive the configuration data, the accelerator requests, and commands from hard processing controller 400. Hard processing controller 400 may, for instance, be a microprocessor. Secure device manager 402 may provide commands, configuration data, and acceleration requests to local sector managers 412 over a bus 414.

In some instances, the configuration data and accelerator requests may optionally be compressed and encrypted. Thus, secure device manager 402 may include decompression engine 404 and decryption engine 406 for decompressing and decrypting data received from the host processor through hard processing controller 400.

Logic sectors 410 may be individually configurable/programmable. This allows each of logic sectors 410 to independently process different tasks in parallel. The parallel processing enabled by logic sectors 410 may be utilized to perform application acceleration (e.g., in a datacenter) for a variety of tasks or jobs simultaneously by reconfiguring different subsets of the logic sectors to perform said tasks.

In order to efficiently manage application acceleration as new tasks are issued to accelerator circuit 310 from the host processor, it may be necessary to perform real-time reconfiguration on any of logic sectors 410 that will be used to process a given newly received task. In other words, reconfiguration of logic sectors 410 may be performed while accelerator circuit 310 is running and may be performed without interrupting the operation of accelerator circuit 310.

The selection of which of logic sectors 410 are to be used for a given task may be determined by identifying which sectors are idle (e.g., not presently performing a task) and by identifying which sectors are handling lower-priority tasks (e.g., tasks without a fixed time budget) compared to the priority of the given task. Some or all of logic sectors 410 that are identified as being idle or as performing less critical tasks may then be selected, and if necessary, reconfigured to perform operations of the given task. Reassignment of logic sectors 410 that are working on a lower-priority task than the given task in need of sector assignment may be performed based on a load-balancing mechanism. It should be noted that those logic sectors 410 that are identified as already being configured to perform the given task may be given selection priority over any sectors that would need to be reconfigured to perform said task.

Figure 5:
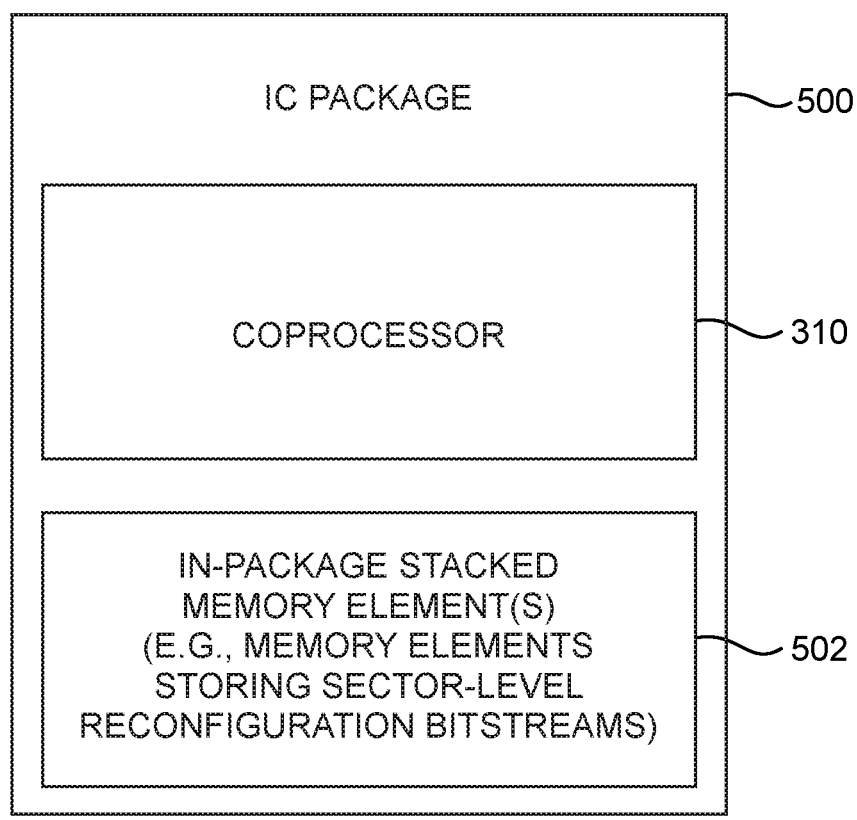
FIG. 5 is an illustrative integrated circuit package that includes a coprocessor programmable integrated circuit and one or more in-package stacked memory elements in accordance with an embodiment.

Configuration data received by accelerator circuit 310 may be stored in memory on the same circuit package as accelerator circuit 310. As shown in FIG. 5, coprocessor 310 and one or more in-package stacked memory elements 502 (sometimes referred to as memory element 502, memory die 502, or memory dies 502) may be mounted on or integrated as part of an IC package 500. Memory die 502, for example, may contain SRAM memory cells or non-volatile memory cells.

In some instances, memory die 502 may be mounted on accelerator circuit 310 directly. Memory die 502 may be connected to accelerator circuit 310 through through-silicon vias (TSVs) that pass through one or more silicon layers of the circuit die of accelerator circuit 310. These TSVs may allow memory die 502 to load configuration data onto sectors 410 of accelerator circuit 310 up to three orders of magnitude faster than traditional reconfiguration techniques.

Configuration data from the host processor may be loaded onto memory die 502 after undergoing processing/routing through secure device manager 402 of accelerator circuit 310 (e.g., after undergoing decompression and decryption). The configuration data may include one or more sector-level reconfiguration bit streams. When one of sectors 410 is selected to perform a task, if that sector needs to be reconfigured to perform the task (e.g., because the sector is presently configured to perform a different task), then secure device manager 402 may provide the selected sector with a pointer to the location of the necessary configuration bit stream (e.g., persona) required to perform that task in memory die 502.

In some scenarios, the memory die 502 may not already have the necessary configuration bit stream stored when said bit stream is needed by the selected sector. In this case, secure device manager 402 may retrieve the necessary configuration bit stream from external memory and may load the retrieved bit stream onto the selected sector and onto memory die 502.

Figure 6:
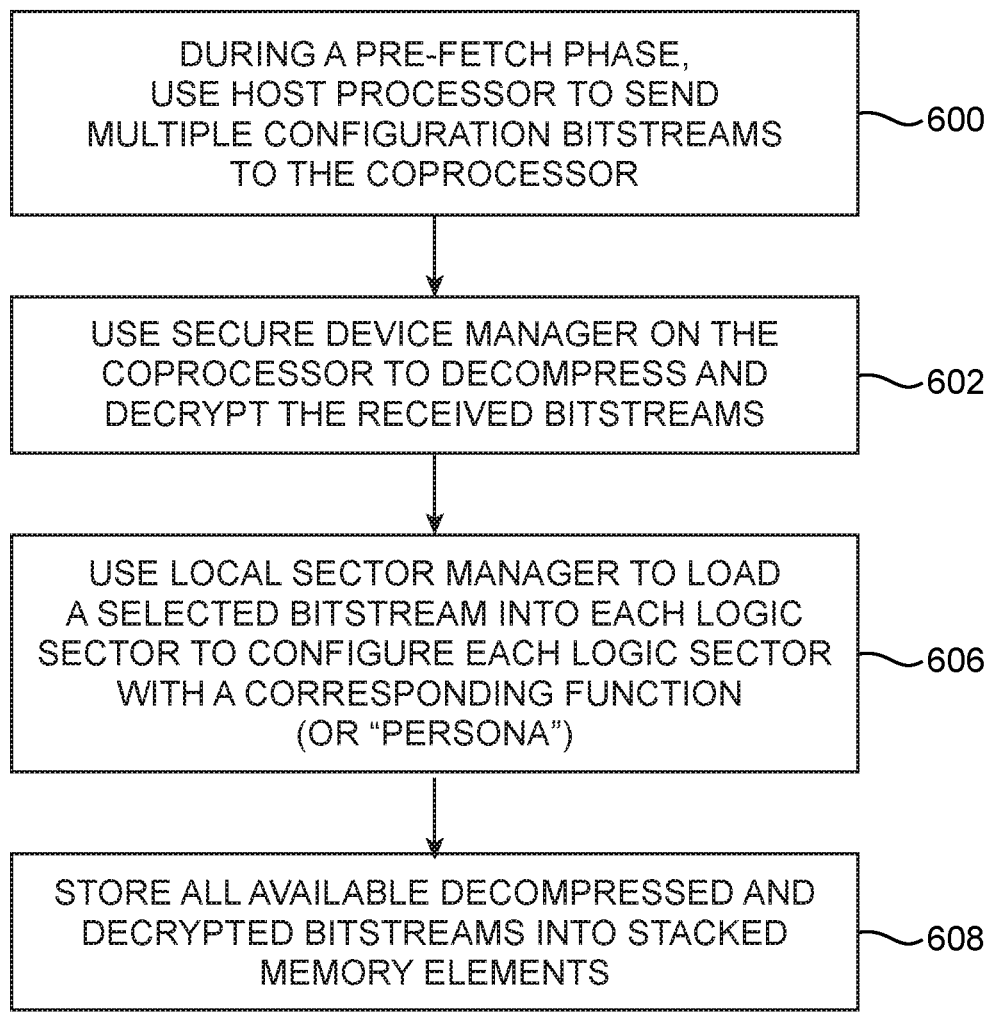
FIG. 6 is a flow chart of illustrative steps for loading configuration bit streams into the logic sectors of the programmable integrated circuit of FIG. 4 in accordance with an embodiment.

Accelerator circuit 310 and memory elements 502 described above in connection with FIGS. 3-5 may perform steps for receiving and storing configuration bit streams from a host processor during a pre-fetch phase of an instruction cycle (see, e.g., illustrative steps of FIG. 6).

At step 600, a pre-fetch phase may be initiated by a host processor (e.g., host processor 302 of FIG. 3) for a set of anticipated configuration bit streams (e.g., corresponding to processing tasks). These configuration bit streams may be provided to a coprocessor (e.g., accelerator circuit 310 of FIGS. 3-5).

At step 602, a secure device manager within the coprocessor (e.g., secure device manager 402 of FIG. 4) may receive the configuration bit streams from the host processor and may perform decompression and decryption operations on the received bit streams.

At step 606, local sector managers within the coprocessor (e.g., local sector managers 412 of FIG. 4) may be used to load selected bit streams into each logic sector to configure each logic sector with a corresponding function or "persona" (e.g., to configure each logic sector to perform a particular task).

At step 608, all available decompressed and decrypted configuration bit streams may be stored into one or more in-package stacked memory elements (e.g., memory elements 502 of FIG. 5).

By storing decompressed and decrypted configuration bit streams in in-package stacked memory elements in this way, these bit streams may be readily accessed for reconfiguring logic sectors with greater speed and power efficiency compared to traditional methods in which configuration bit streams are only retrieved from off-chip storage.

Figure 7:
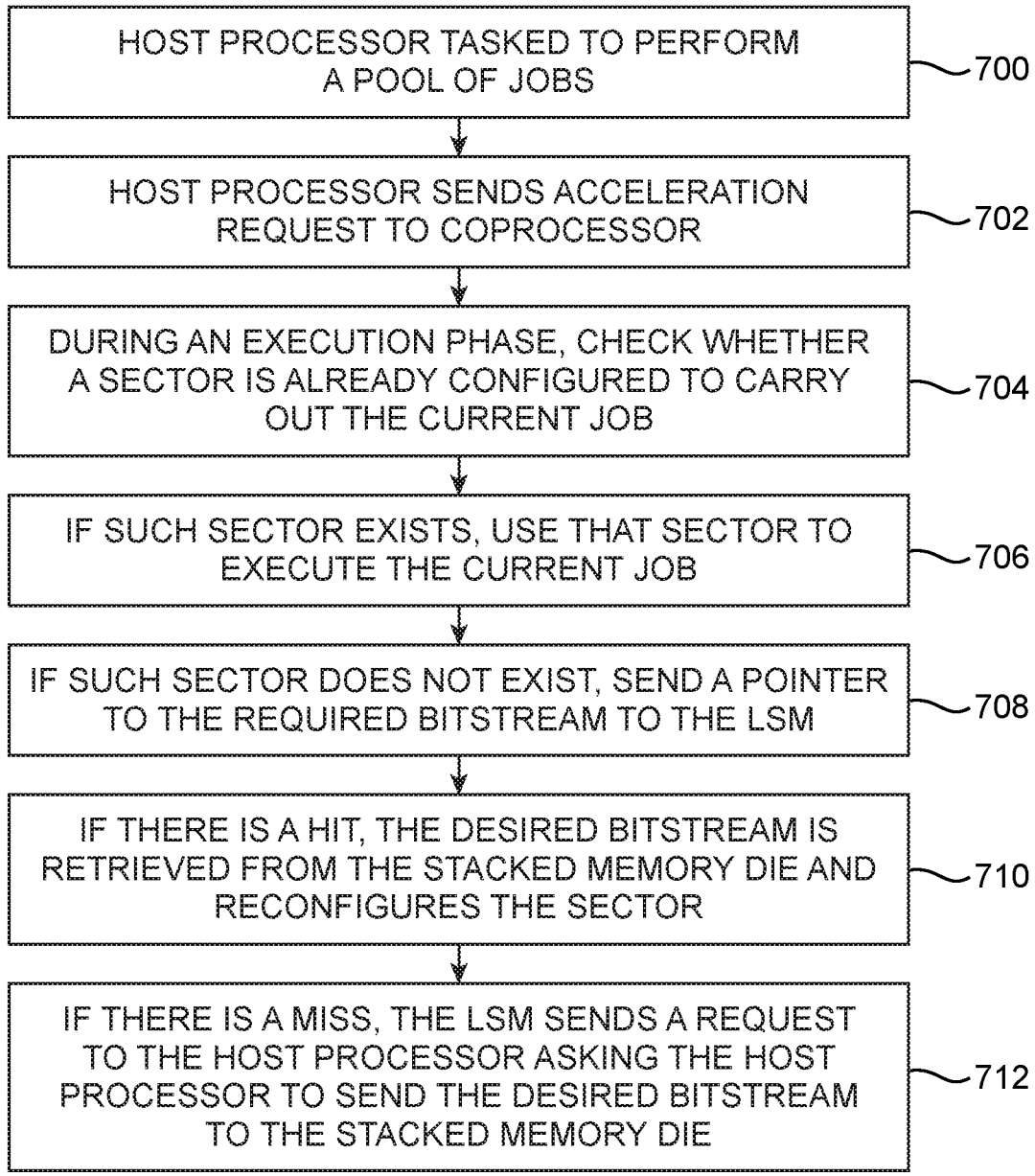
FIG. 7 is a flow chart of illustrative steps for performing logic sector management for the programmable integrated circuit of FIG. 4 to handle acceleration requests received from a host processor in accordance within an embodiment.

Accelerator circuit 310 and memory elements 502 described above in connection with FIGS. 3-5 may perform steps for managing sectors to perform a pool of jobs/tasks received from a host processor (see, e.g., illustrative steps of FIG. 7).

At step 700, a host processor (e.g., host processor 302 of FIG. 3) may be tasked to perform a pool of jobs/tasks. In order to improve the speed at which these tasks are performed (e.g., to accelerate the tasks), a coprocessor (e.g., accelerator circuit 310 of FIGS. 3-5) may be used to perform at least a subset of the pool of tasks.

At step 702, the host processor may send an acceleration request to the coprocessor. This acceleration request may be received by a secure device manager (e.g., secure device manager 402 of FIG. 4), which may identify one or more logic sectors (e.g., of logic sectors 410 of FIG. 4) that are available to perform one or more given tasks (e.g., current jobs) associated with the acceleration request.

At step 704, during an execution phase of the instruction cycle, the secure device manager may communicate with local sector managers (e.g., local sector managers 412 of FIG. 4) at each of the logic sectors to determine whether any of the logic sectors are already configured to carry out the given task. Depending on whether a sector exists that is pre-configured to carry out the given task, the process may proceed to either step 706 or step 708.

At step 706, if such a pre-configured sector exists, that sector may be selected and used to execute the given task.

At step 708, if such a pre-configured sector does not exist, the host processor may provide a local sector manager of an available sector with a pointer to the location of the configuration bit stream required for performing the given task that is stored in a stacked memory die (e.g., memory die 502 of FIG. 5). Configuration data stored on the stacked memory die may be unencrypted. However, it is possible that the required configuration bit stream will not be present in the stacked memory die. Thus, the local sector manager may check to determine whether the required configuration data is present in the stacked memory die. If the required configuration data is present in the stacked memory die, then the process may proceed to step 710. Otherwise, the process may proceed to step 712.

At step 710, if the required configuration data is stored in the stacked memory die (e.g., if there is a cache hit), the required or desired configuration bit stream may be retrieved from the stacked memory die and may be used to reconfigure the available sector (e.g., by loading the required configuration bit stream onto the available sector). The configuration image stored in the stacked memory die may not be encrypted. The stacked memory die may act as an instruction cache from which configuration data (e.g., bit streams) are fetched by the local sector managers for reconfiguring the logic sectors.

At step 712, if the required configuration data is not stored in the stacked memory die (e.g., if there is a cache miss), the local sector manager of the available sector may send a request to the host processor asking that the host processor provide the required configuration bit stream to the stacked memory die. The local sector manager may then load the required configuration bit stream onto the available sector, thereby reconfiguring the available sector. In some scenarios, the local sector manager may receive the required configuration bit stream from the host processor directly through the secure device manager, in which case the required configuration bit stream may also be stored on the stacked memory die.

It may be desirable to connect memory dies to a coprocessor (e.g., coprocessor 310 of FIG. 5) in a stacked arrangement using through-silicon-vias (TSVs).

Figure 8:
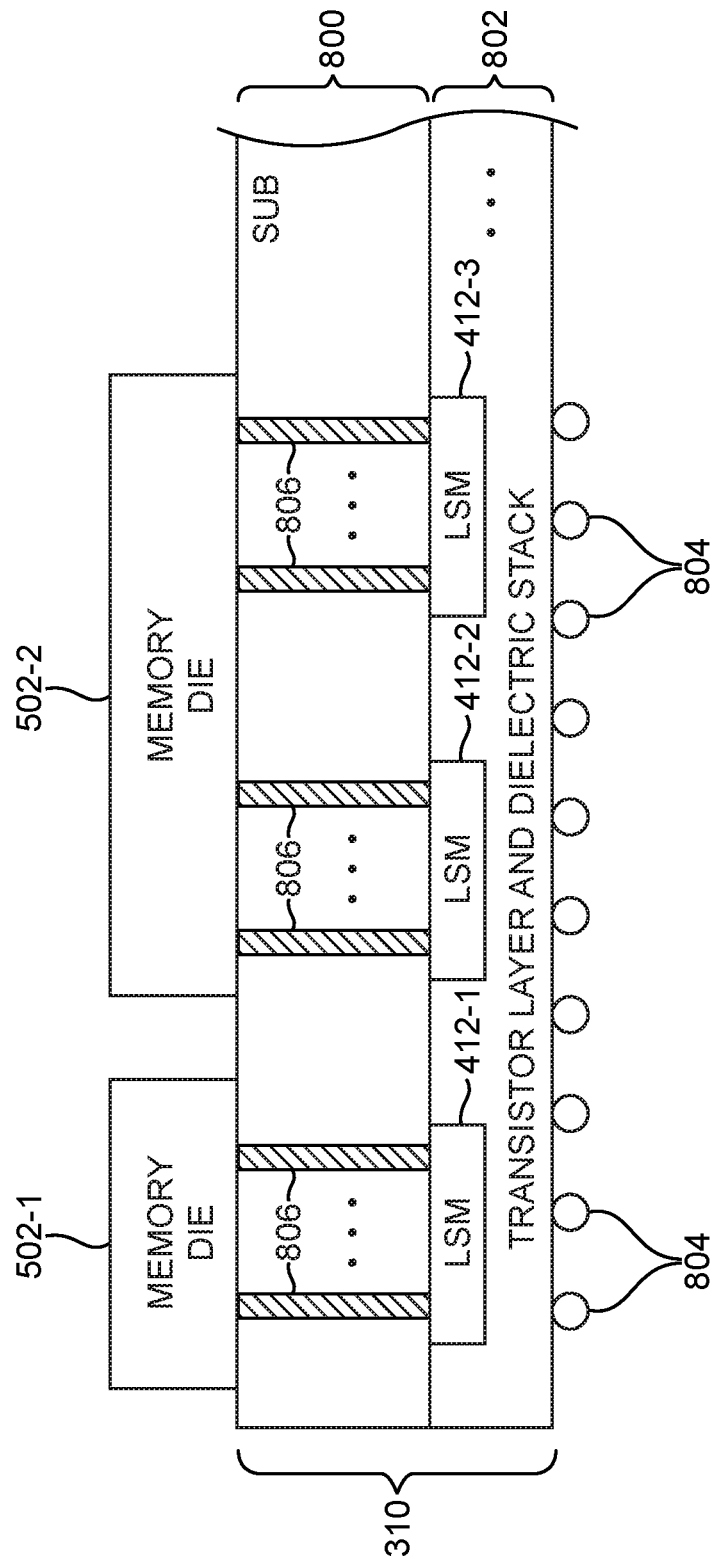
FIG. 8 is a cross-sectional side view of the integrated circuit package of FIG. 5 in accordance within an embodiment.

As shown in FIG. 8, memory dies 502-1 and 502-2 may be stacked on a semiconductor (e.g., silicon, silicon carbide, gallium arsenide, gallium nitride) substrate 800 of coprocessor 310. Memory dies 502-1 and 502-2 may be electrically connected to local sector managers (LSMs) 412-1, 412-2, and 412-3 and to one or more data registers (DRs) within coprocessor 310 using TSVs 806. Memory dies 502 may be stacked between coprocessor 310 and a heat spreader (not shown). Memory dies 502 may be temperature tolerant as a result.

TSVs 806 may, for example, be formed through the metallization of through-holes in substrate 800. These through-holes may be formed by etching (e.g., buffered hydrofluoric acid (BHF) etching, plasma etching) and the metallization (e.g., copper, aluminum) may be deposited or evaporated into the through-holes (e.g., using electron-beam evaporation, sputtering, chemical vapor deposition).

Transistor layer and dielectric stack 802 (sometimes referred to herein as active layers 802) may be formed on a surface of substrate 800 opposite the surface on which memory dies 502 are formed. Active layers 802 may include LSMs 412, sectors associated with each of LSMs 412, electrically conductive interconnects (e.g., copper or aluminum interconnects), and other circuitry for coprocessor 310.

Coprocessor 310 may be coupled to an integrated circuit package (e.g., integrated circuit package 500 of FIG. 5) through solder bumps 804. In some cases, solder bumps 804 may instead be solder balls. Solder bumps 804 may connect coprocessor 310 to an integrated circuit package, and may convey ground voltage signals, power voltage signals, and/or control signals to various circuits within coprocessor 310 from external circuitry (e.g., power supplies, control circuits) contained within or connected to the integrated circuit package.

By stacking memory dies 502 directly onto substrate 800, energy consumption and latency may be reduced. Reduction in energy consumption and latency are achieved due to the close proximity of the stacked memory dies 502 to configuration RAM cells in coprocessor 310 (e.g., in sectors 410) and due to the increased energy efficiency of TSVs 806 compared to traditional planar metal routing.

Figure 9A:
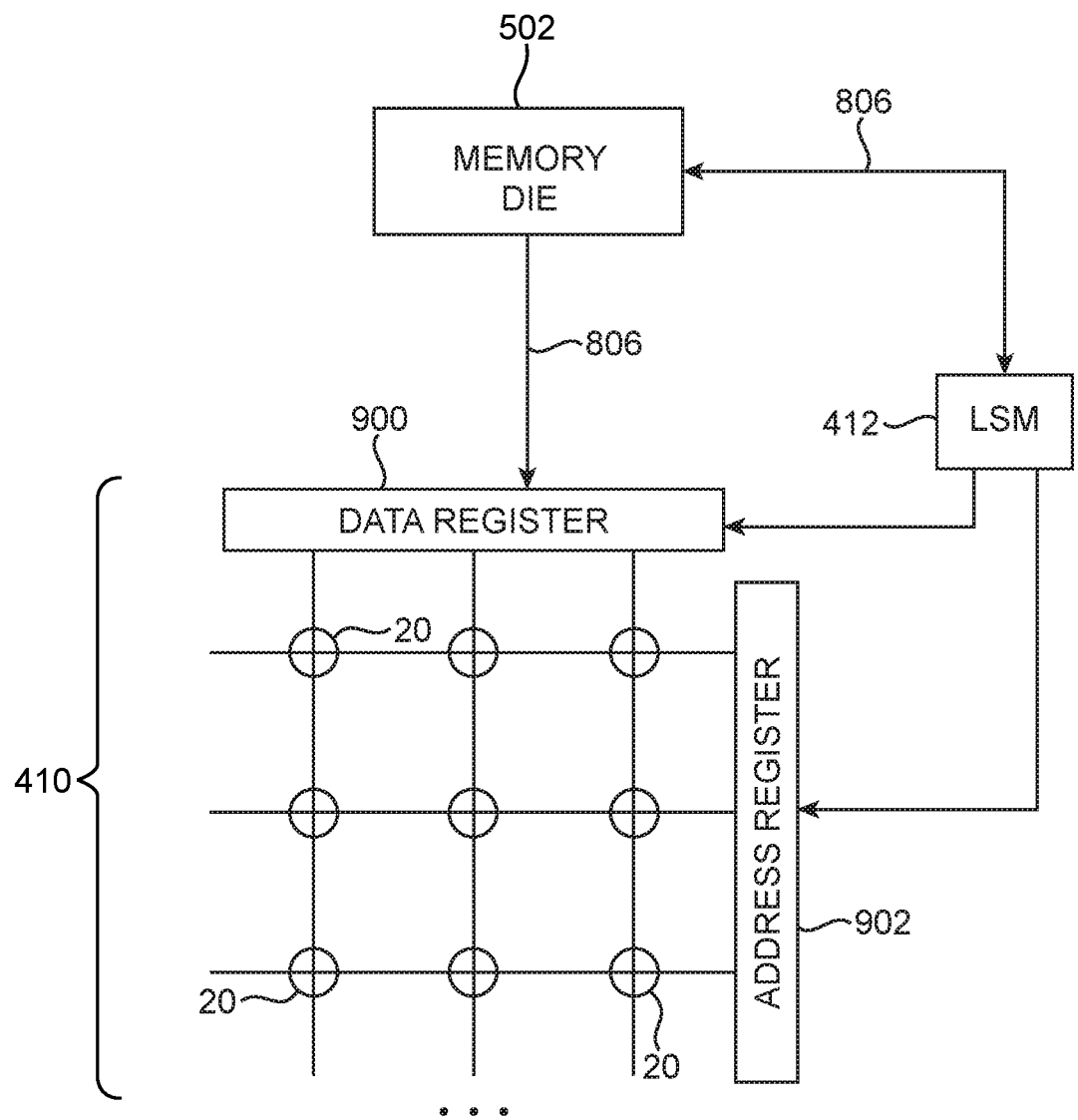
FIG. 9A is a diagram an illustrative sector in which a local sector manager accesses each memory element in the sector using a single data register and a single address register in accordance with an embodiment.
Figure 9B:
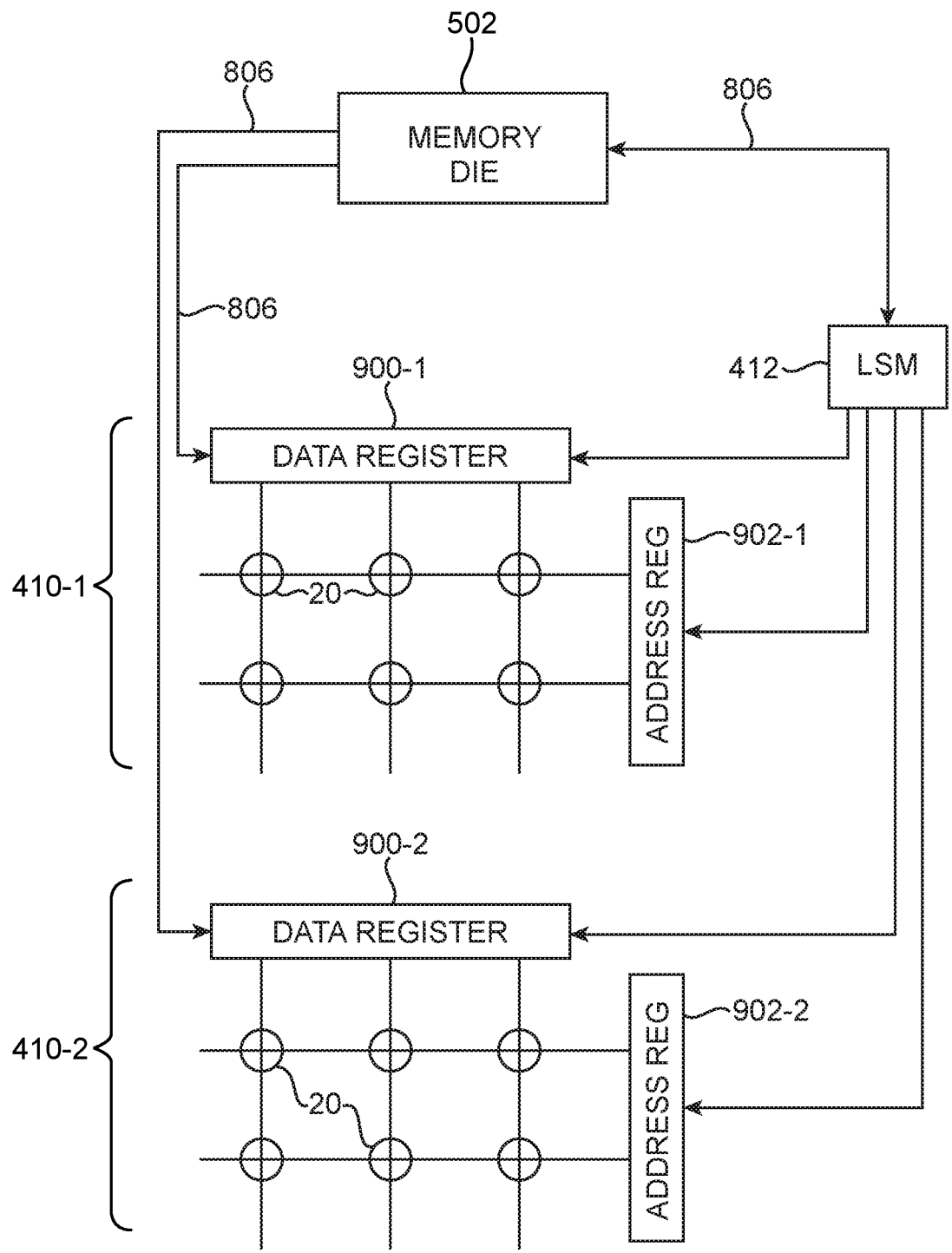
FIG. 9B is a diagram an illustrative sector in which a local sector manager accesses subsets of memory element in the sector using unique data registers and address registers for each subset of memory elements in accordance with an embodiment.
Figure 9C:
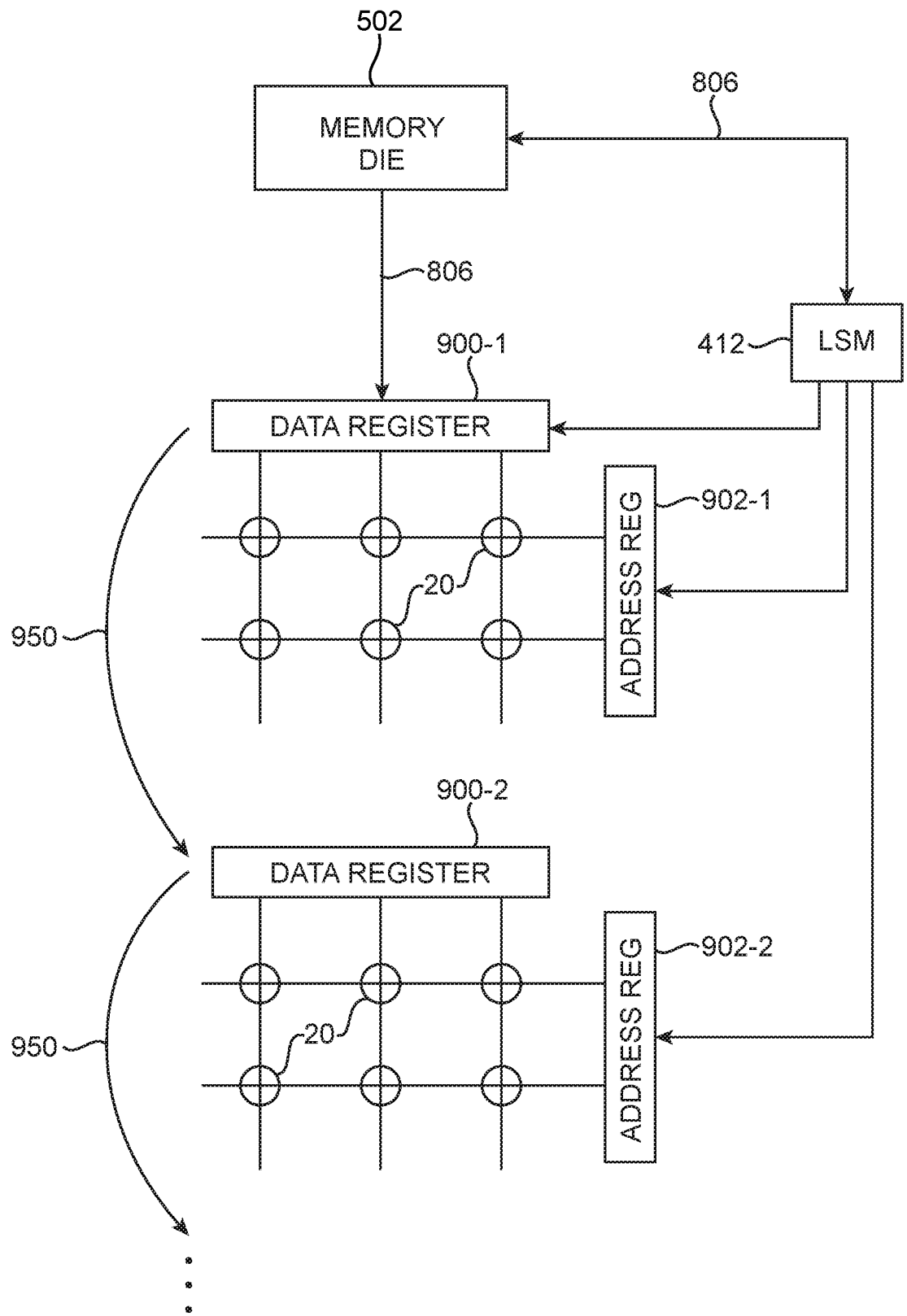
FIG. 9C is a diagram an illustrative sector in which a local sector manager accesses subsets of memory element in the sector using unique data registers and address registers for each subset of memory elements, and in which the data registers are pipelined in accordance with an embodiment.

As shown in FIGS. 9A-9C, each memory die 502 may communicate with one or more data registers 900 and an LSM 412, both corresponding to a logic sector 410.

As shown in FIG. 9A, sector 410 may include data register 900, address register 902, and an array of CRAM cells 20 arranged in rows and columns. Data register 900 may be coupled to columns of CRAM cells 20 through data lines that each correspond to an individual column. Address register 902 may be coupled to rows of CRAM cells 20 through address lines that each correspond to an individual row. LSM 412 may communicate with memory die 502, data register 900, and address register 902 to coordinate loading data onto any given subset of CRAM cells 20.

Paths 806 in FIG. 9A may represent through-silicon via (TSV) interconnect paths formed in the coprocessor. Memory die 502 may be coupled to data register 900 through a subset of TSVs 806 and may be coupled to LSM 412 through another subset of TSVs 806. Data/configuration bits from memory die 502 may be loaded into data register 900 through TSVs 806. The data/configuration bits may then be loaded onto one or more of CRAM cells 20 based on control signals provided to data register 900 and address register 902 by LSM 412.

As shown in FIG. 9B, sector 410 may be divided into multiple subsectors 410-1 and 410-2. Some features of FIG. 9B may be similar to those of FIG. 9A described above and are therefore not described again in detail here for the sake of brevity. Each of subsectors 410-1 and 410-2 may include respective data registers 900-1 and 900-2 and respective address registers 902-1 and 902-2. Memory die 502 may provide data/configuration bits to data register 900-1 and to data register 900-2 using different sets of TSVs 806. LSM 412 may provide control signals to each of data registers 900-1 and 900-2 and address registers 902-1, 902-2 individually. In this way, data/configuration bits for subsector 410-1 and for subsector 410-2 may be loaded onto data registers 900-1 and 900-2, and subsequently onto corresponding CRAM cells 20, simultaneously in parallel. The portion of CRAM cells 20 associated with subsector 410-1 and the portion of CRAM cells 20 associated with subsector 410-2 may be considered separate sub-arrays of CRAM memory cells.

As shown in FIG. 9C, pipelines 950 may be used to connect data registers 900-1 and 900-2 of different subsectors of sector 410. Some features of FIG. 9C may be similar to those of FIGS. 9A and 9B described above and are therefore not described again in detail here for the sake of brevity.

Data registers 900-1 and 900-2 may be pipelined using pipeline 950. Memory die 502 may provide data/configuration bits to data register 900-1, but it may not be necessary to provide data/configuration bits to data register 900-2 because data registers 900-1 and 900-2 are pipelined. Specifically, data/configuration bits provided to data register 900-1 over TSVs 806 from memory die 502 may be pipelined to data register 900-2. Thus, data register 900-2 does not need to receive data/configuration bits from memory die 502 directly. In this way, data for multiple CRAM frames may be loaded into data registers 900-1 and 900-2 and may then be written to CRAM cells 20 for different subsectors of sector 410 simultaneously in parallel. While only two pipeline stages are shown here, it should be understood that sector 410 may instantiate any desired number of pipeline stages, given that enough rows are present to support each pipeline stage.

LSM 412 may provide control signals to data register 900-1, but it may not be necessary to provide control signals to data register 900-2 due to pipelining between data registers 900-1 and 900-2 provided by pipelines 950. In some embodiments, address registers 902-1 and 902-2 may be combined into a single address register that is coupled to LSM 412 via a single control line.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit package, comprising:
   an integrated circuit that includes a substrate and programmable circuitry having a plurality of programmable circuitry configuration controllers to configure different respective portions of the programmable circuitry formed on a first plane of the substrate;
a first external memory die that is mounted directly on a second plane of the substrate of the integrated circuit opposite the first plane of the substrate of the integrated circuit and that is stacked directly opposite and is coupled to a first programmable circuitry configuration controller of the plurality of the programmable circuitry configuration controllers, wherein the first programmable circuitry configuration controller is placed within width range of the first external memory die on the first plane; and
a second external memory die that is mounted directly on the second plane of the substrate of the integrated circuit and that is stacked directly opposite and is coupled to a second programmable circuitry configuration controller of the plurality of the programmable circuitry configuration controllers, wherein the second programmable circuitry configuration controller is placed within width range of the second external memory die on the first plane, wherein the first and second external memory dies are mounted in the same plane over the integrated circuit.

2. The integrated circuit package of claim 1, wherein the integrated circuit includes through-silicon vias formed through the substrate through which configuration bit streams are conveyed from the first and second external memory dies to the programmable circuitry.

3. The integrated circuit package of claim 2, wherein the programmable circuitry configuration controllers are configured to retrieve the configuration bit streams from the first and second external memory dies.

4. The integrated circuit package of claim 3, wherein a first portion of the respective portions of the programmable logic circuitry comprises:
an array of memory cells;
an address register coupled to the array of memory cells; and
a data register coupled to the array of memory cells, wherein the data register is also coupled to the first external memory die through at least some of the through silicon vias.

5. The integrated circuit package of claim 3, wherein a first portion of the respective portions of the programmable logic circuitry comprises:
a first sub-array of memory cells;
a second sub-array of memory cells;
a first data register coupled to the first sub-array of memory cells; and
a second data register coupled to the second sub-array of memory cells, wherein the first programmable circuitry configuration controller associated with the first portion of the respective portions of the programmable logic circuitry controls the first and second data registers.

6. The integrated circuit package of claim 5, wherein the first and second data registers are configurable to load a configuration bit stream in parallel from the first external memory die.

7. The integrated circuit package of claim 5, wherein the first data register is configurable to transfer data from the first data register to the second data register.

8. The integrated circuit package of claim 5, wherein the first and second data registers are configurable to load a selected one of the configuration bit streams into the first and second sub-arrays of memory cells in parallel.

9. The integrated circuit package of claim 1, comprising a transistor layer and dielectric stack formed on the substrate.

10. The integrated circuit package of claim 9, wherein the plurality of programmable circuitry configuration controllers are included in the transistor layer and dielectric stack.

11. The integrated circuit package of claim 9, wherein the transistor layer and dielectric stack include sectors associated with the plurality of programmable circuitry configuration controllers and electronically conductive interconnects.

12. A system, comprising:
a host processor;
a coprocessor coupled to the host processor, wherein the coprocessor comprises:
a substrate;
a first programmable circuitry region manager that is formed on a first plane of the substrate;
a first programmable circuitry region that is formed on the first plane of the substrate and that is managed by the first programmable circuitry region manager;
a second programmable circuitry region manager that is formed on the first plane of the substrate;
a second programmable circuitry region that is formed on the first plane of the substrate and that is managed by the second programmable circuitry region manager;
a first external memory die that is mounted directly on a second plane opposite the first plane of the substrate of the coprocessor and that is stacked directly opposite and is coupled to the first programmable circuitry region manager using first through-silicon vias in the substrate, wherein the first programmable circuitry region manager is placed within width range of the first external memory die on the first plane; and
a second external memory die that is mounted directly on the second plane of the substrate of the coprocessor and that is stacked directly opposite and is coupled to the second programmable circuitry region manager using second through-silicon vias in the substrate, wherein the second programmable circuitry region manager is placed within width range of the second external memory die on the first plane, wherein the first and second external memory dies are mounted in the same plane over the coprocessor.

13. A method of operating an integrated circuit package that includes a programmable logic circuitry disposed on a first plane of a substrate and a plurality of memory dies respectively stacked directly on a second plane of the substrate opposite the first plane, the method comprising:
configuring, using a first configuration controller of the programmable logic circuitry, a first region of the programmable logic circuitry to perform a first custom function,
configuring, using a second configuration controller of the programmable logic circuitry, a second region of the programmable logic circuitry to perform a second custom function;
conveying a first configuration bit stream from a first memory die of the plurality of memory dies to the first region of the programmable logic circuitry by way of through silicon vias formed in the substrate, wherein the first memory die is stacked directly opposite and is coupled to the first configuration controller and the first configuration controller is placed within width range of the first memory die on the first plane;

conveying a second configuration bit stream from a second memory die of the plurality of memory dies to second first region of the programmable logic circuitry by way of through silicon vias formed in the substrate, wherein the second memory die is stacked directly opposite and is coupled to the second configuration controller and the second configuration controller is placed within width range of the second memory die on the second plane;

reconfiguring the first region of the programmable circuitry using at least a portion of the first configuration bit stream so that the programmable circuitry is configured to perform a third custom function; and reconfiguring the second region of the programmable circuitry using at least a portion of the second configuration bit stream so that the programmable circuitry is configured to perform a fourth custom function.

14. The method of claim 13, wherein using the programmable logic circuitry to perform the first custom function comprises:

using the first configuration controller to load a first portion of a previously received configuration bit stream into the first region of the programmable logic circuitry.

15. The method of claim 14, wherein using the programmable logic circuitry to perform the second custom function comprises:

using the second configuration controller to load a second portion of the previously received configuration bit stream into the second region of the programmable logic circuitry.

16. The method of claim 13, wherein the first region of the programmable logic circuitry performs the first custom function and the second region of the programmable logic circuitry performs the second custom function simultaneously.

* * * * *